United States Patent
Choi et al.

(10) Patent No.: US 7,542,521 B2
(45) Date of Patent: Jun. 2, 2009

(54) DIRECT-CONVERSION FREQUENCY MIXER

(75) Inventors: Byoung Gun Choi, Daejeon (KR); Seok Bong Hyun, Daejeon (KR); Geum Young Tak, Seoul (KR); Hee Tae Lee, Daejeon (KR); Seong-Su Park, Daejeon (KR); Chul Soon Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 630 days.

(21) Appl. No.: 11/226,045

(22) Filed: Sep. 14, 2005

(65) Prior Publication Data

US 2006/0088122 A1 Apr. 27, 2006

(30) Foreign Application Priority Data

Oct. 22, 2004 (KR) .................. 10-2004-0084718

(51) Int. Cl.
*H03K 9/00* (2006.01)
(52) U.S. Cl. ................. 375/316; 375/235; 375/261; 375/280; 375/282; 375/283; 375/331
(58) Field of Classification Search ............... 375/316, 375/235, 261, 280, 282, 283, 298, 331
See application file for complete search history.

(56) References Cited

U.S. PATENT DOCUMENTS

| 5,995,819 | A | 11/1999 | Yamaji et al. |
| 6,373,345 | B1 * | 4/2002 | Kimppa et al. ............... 332/105 |
| 2004/0063419 | A1 * | 4/2004 | Molnar et al. ............... 455/323 |
| 2004/0190647 | A1 * | 9/2004 | Malone et al. ............... 375/322 |

OTHER PUBLICATIONS

Behzad et al. (A 5-GHz direct-conversion CMOS transceiver utilizing automatic frequency control for the IEEE 802.11a wireless LAN standard, IEEE Journal of Solid-State Circuits, (Dec. 2003), p. 2209-2220, vol. 38, No. 12).*
"An I/Q Active Balanced Harmonic Mixer with IM2 Cancelers and a 45° Phase Shifter," Yamaji et al, IEEE Journal of Solid-State Circuits, vol. 33, No. 12, Dec. 1998, pp. 2240-2246, © 1998 IEEE.
"An Si-SiGe BiCMOS Direct Conversion Mixer with Second-Order and Third-Order Nonlinearity Cancellation for WCDMA Applications," Sheng et al, IEEE Transactions on Microwave Theory and Techniques, vol. 51, No. 11, Nov. 2003, pp. 2211-2220, © 2003 IEEE.

* cited by examiner

*Primary Examiner*—Shuwang Liu
*Assistant Examiner*—Kabir A Timory
(74) *Attorney, Agent, or Firm*—Ladas & Parry LLP

(57) ABSTRACT

Provided is a direct-conversion frequency mixer for down converting a radio frequency (RF) signal into a baseband signal, in which a single phase RF signal and a quadrature location oscillation (quadrature LO) signal are used to generate the baseband signal, the frequency mixer comprising a first frequency mixing unit that uses quadrature LO signals having respective phases of 0 degrees and 180 degrees to directly down-convert the single phase RF signal into the in-phase baseband signal, and a second frequency mixing unit that uses quadrature LO signals having respective phases of 90 degrees and 270 degrees to directly down-convert the single phase RF signal into the quadrature-phase baseband signal, whereby drains and sources of the transistor for receiving the quadrature LO signal and the transistor for receiving the RF signal are connected in common, thus enabling low power source voltage driving.

13 Claims, 4 Drawing Sheets

DIRECT-CONVERSION FREQUENCY MIXER

CROSS-REFERENCE TO RELATED APPLICATION

This application claims priority to and the benefit of Korean Patent Application No. 2004-84718, filed Oct. 22, 2004, the disclosure of which is incorporated herein by reference in its entirety.

BACKGROUND

1. Field of the Invention

The present invention relates to a direct-conversion frequency mixer for down converting a radio frequency signal to a based band signal, and more specifically, to a direct-conversion frequency mixer having a high linearity even at a low power source voltage.

2. Discussion of Related Art

In a general wireless communication system using radio waves, a frequency converter receives a very low power radio frequency (RF) signal through an antenna and a quadrature local oscillation (quadrature LO) signal from an internal local oscillator of the system, and converts the RF signal into a baseband frequency signal corresponding to a frequency difference between the RF signal and the quadrature LO signal. This frequency conversion can be simply achieved by a nonlinear circuit for multiplying the RF signal by the quadrature LO signal. Thus, the frequency converter generally includes a core unit used as an analog multiplier, an input/output buffer, a filter, and the like. A general theory and a prior art relating to the frequency converter circuit have been disclosed in "RF Microelectronics" by B. Razavi (Prentice Hall, 1998), and "The Design of CMOS Radio-Frequency Integrated Circuits" by Thomas Lee (Cambridge University Press, 1998).

With recent improvements in semiconductor technology, a silicon device such as a complementary metal-oxide-semiconductor (CMOS) transistor typically used in a digital VLSI chip is often applied to a radio frequency (RF) circuit. However, due to increasing integration density, a gate line width of the CMOS transistor has been reduced from 130 nm to about 90 nm while a power source voltage of a digital circuit unit has been reduced to about 1.5V or less. When different power source voltages are applied to the digital circuit unit and the RF/analog circuit unit, an additional power source conversion circuit such as a DC-DC converter is required, which increases the cost of the parts and power consumption. This is not conducive to providing consumers with the low cost and low power consumption they have been demanding. Therefore, there is a need for an RF circuit capable of being driven with a low power source voltage, like a digital circuit. Thus, a circuit with which the structure of circuits included in the RF chip may be fundamentally changed should be developed.

In the conventional RF/analog technology, more than two transistors connected in a stacked or cascade structure are used as a current bias or a current source to achieve a stable characteristic irrespective of changes in operational conditions such as process, temperature or the like. In the case of a frequency mixer circuit, a quadrature LO signal input unit 10 including quadrature LO signal conversion transistors Q1 and Q2 and an RF signal input unit 11 including an RF signal conversion transistor Q3 are connected in the stacked structure, as shown in FIG. 1. Such a Gilbert multiplier structure uses divided power source voltage for terminals, so that a voltage swing at an output terminal is low. Further, when the power source voltage is reduced to 1.5V or less, an operational voltage range is limited to an active region of a transistor, thereby lowering linearity.

In an ultra wide-band system where an in-band interference signal having a very high power level is directly input, in particular, reduction of the linearity of the frequency mixer becomes a serious problem. In the ultra wide-band system of 3.1 to 10.6 GHz, communication employs very weak radio waves of less than −41 dBm/MHz. Such an ultra wide-band system can achieve a high transmission rate of about 1 Gbps within a local area. Contrary to the existing wireless communication system in which only a certain frequency band is used and the other bands are blocked using an RF filter, an ultra wide-band transceiver receives all signals of the wide frequency band. Therefore, interference signals 30 dB or more larger than a desired signal are applied together with the desired signal to the frequency mixer, so that there arise nonlinear effects such as generation of a spurious signal due to intermodulation, degradation of sensitivity due to saturation, blocking, etc. Therefore, there is need for developing a frequency mixer having high linearity and using a low power source voltage.

SUMMARY OF THE INVENTION

The present invention is directed to a frequency mixer having high linearity and using a low power source voltage.

One aspect of the present invention provides a direct-conversion frequency mixer comprising: a first frequency mixing unit for direct-converting a single phase radio frequency signal into an in-phase baseband signal by using quadrature local oscillation signals having respective phases of 0 degrees and 180 degrees; and a second frequency mixing unit for direct-converting the single phase radio frequency signal into a quadrature-phase baseband signal by using quadrature local oscillation signals having respective phases of 90 degrees and 270 degrees, wherein the first and second frequency mixing units are driven by a bias voltage supplied from a single voltage source.

The first frequency mixing unit may comprise: a first transistor having a gate through which the quadrature local oscillation signal having a phase of 0 degrees is received; a second transistor having a gate through which the quadrature local oscillation signal having a phase of 180 degrees is received; a third transistor having a source and a drain respectively connected to the source and the drain of the first transistor, and having a gate through which the radio frequency signal is received; and a fourth transistor having a source and a drain respectively connected to the source and the drain of the second transistor, and having a gate through which the radio frequency signal is received, wherein the bias voltage may be applied to the drains of the first to fourth transistors.

The second frequency mixing unit may comprise: a first transistor having a gate through which the quadrature local oscillation signal having a phase of 90 degrees is received; a second transistor having a gate through which the quadrature local oscillation signal having a phase of 270 degrees is received; a third transistor having a source and a drain respectively connected to the first transistor, and having a gate through which the radio frequency signal is received; and a fourth transistor having a source and a drain respectively connected to the source and the drain of the second transistor, and having a gate through which the radio frequency signal is received, wherein the bias voltage may be applied to the drains of the first to fourth transistors.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, and may vary.

Figure 2:
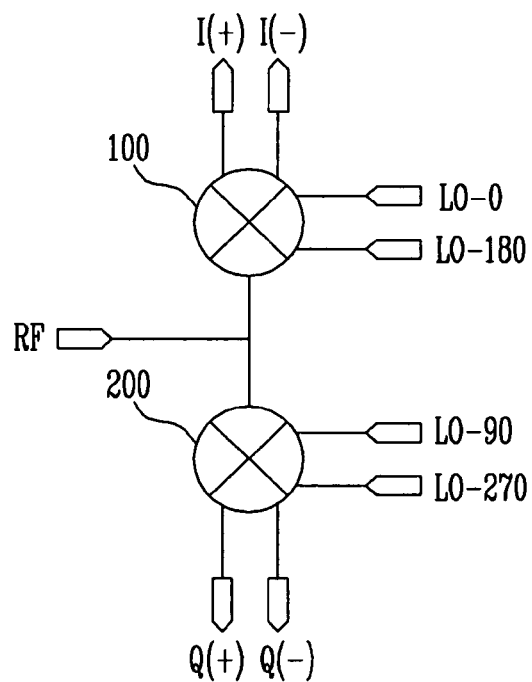
FIG. 2 is a schematic diagram of a direct-conversion frequency mixer according to an embodiment of the present invention.

FIG. 2 is a schematic diagram of a direct-conversion frequency mixer according to an embodiment of the present invention.

The direct-conversion frequency mixer according to an embodiment of the present invention has a structure capable of obtaining a quadrature baseband signal using a single phase RF signal and a quadrature LO signal. A first frequency mixing unit 100 uses the quadrature LO signals LO-0, LO-180 having respective phases of 0 degree and 180 degrees to directly down-convert the single phase RF signal into an in-phase baseband signal, and a second frequency mixing unit 200 uses quadrature LO signals LO-90, LO-270 having respective phases of 90 degrees and 270 degrees to directly down-convert the single phase RF signal into the quadrature baseband signal.

The first frequency mixing unit 100 uses quadrature LO signals LO-0, LO-180 having respective phases of 0 degrees and 180 degrees to directly down-convert the single phase RF signal, thereby generating in-phase baseband outputs I(+) and I(−). In addition, the second frequency mixing unit 200 uses quadrature LO signals LO-90, LO-270 having respective phases of 90 degrees and 270 degrees to directly down-convert the single phase RF signal into the quadrature baseband signal, thereby generating in-phase baseband outputs Q(+) and Q(−).

The first and second frequency mixing units 100 and 200 are achieved by the same circuit and distinguished by a phase of the input quadrature LO signal. The first and second frequency mixing units 100 and 200 will now be described in detail with reference to FIGS. 3A and 3B.

Figure 3A:
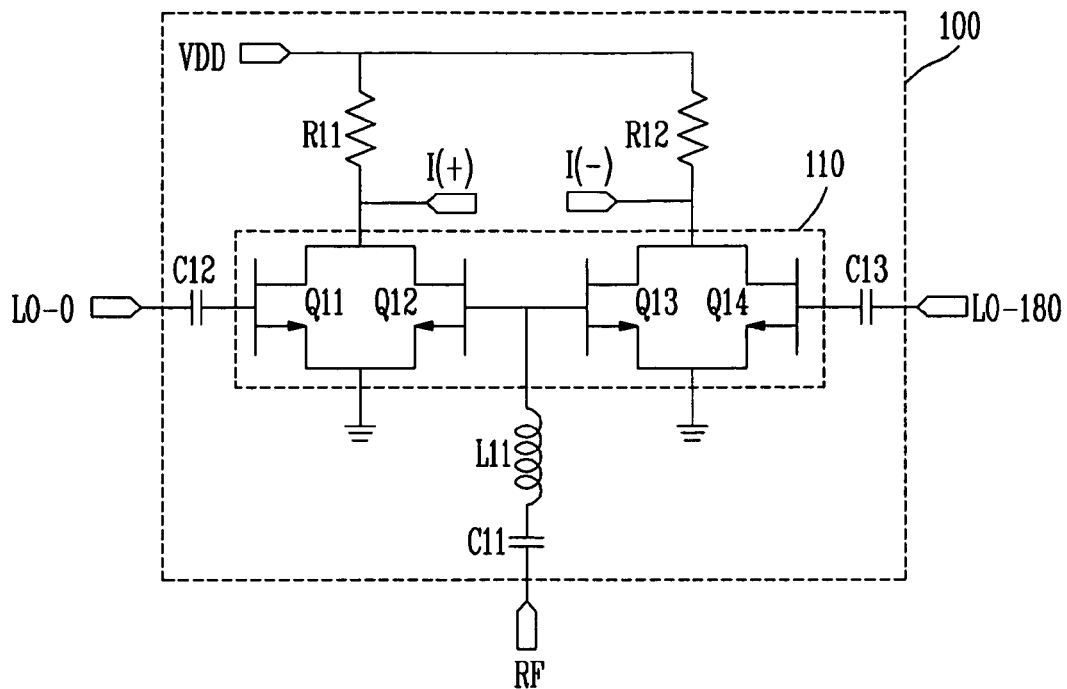
FIGS. 3A and 3B are detailed circuit diagrams of first and second frequency mixing units shown in FIG. 2.

FIG. 3A is a detailed circuit diagram of the first frequency mixing unit 100 that directly down-converts a single phase RF signal into in-phase baseband signals I(+) and I(−) different in a phase by 180 degrees.

A core unit 110 that performs a switching operation using the quadrature LO signal includes a transistor Q11 to which the quadrature LO signal having a phase of 0 degrees (LO-0) is applied through a gate, a transistor Q14 to which the quadrature LO signal having a phase of 180 degrees (LO-180) is applied through a gate, and transistors Q12 and Q13 having sources and drains commonly connected to the respective transistors Q11 and Q14. A power source voltage VDD is applied from a voltage source through drains of the transistors Q11 and Q12 and the transistors Q13 and Q14.

The quadrature LO signal has the same frequency as a carrier wave of the RF signal, so that it is directly converted into a baseband signal without transition to an intermediate frequency. The down-converted in-phase baseband signals applied to the drains (I(+) node) of the transistors Q11 and Q12 and the drains (I(−) node) of the transistors Q13 and Q14 are different in a phase by 180 degrees. An inductor L11 of the RF signal input unit is matched to an input impedance of the frequency mixer, and a capacitor C11 is used for AC coupling of the RF signal. Further, capacitors C12 and C13 used in the quadrature LO signal input units (LO-0 and LO-180) are used for AC coupling of the quadrature LO signal, respectively.

Figure 3B:
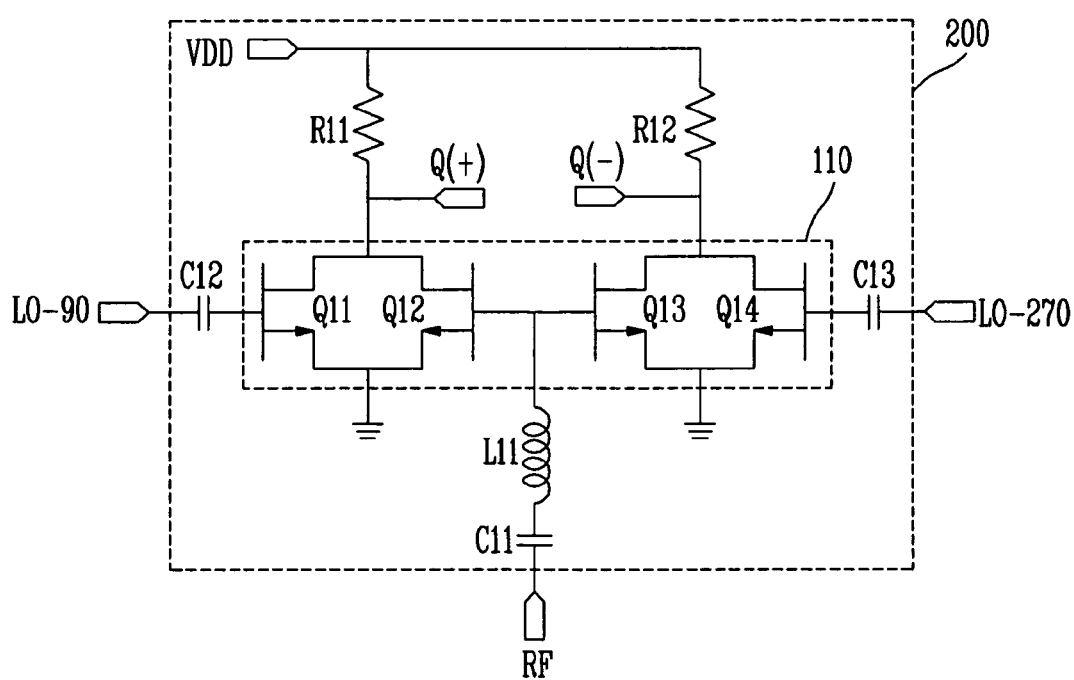

FIG. 3B is a detailed circuit diagram of the second frequency mixing unit 200 that directly down converts a single phase RF signal into quadrature-phase baseband signals Q(+) and Q(−) different in a phase by 180 degrees, which is the same as in FIG. 3A. The quadrature LO signals having respective phases of 90 degrees and 270 degrees are input through the quadrature LO signal input units LO-90 and LO-270, respectively, and the down converted quadrature phase baseband signals at the drains (Q(+) node) of the transistors Q11 and Q12 and the drains (Q(−) node) of the transistors Q13 and Q14 have a phase difference of 180 degrees.

Figure 4:
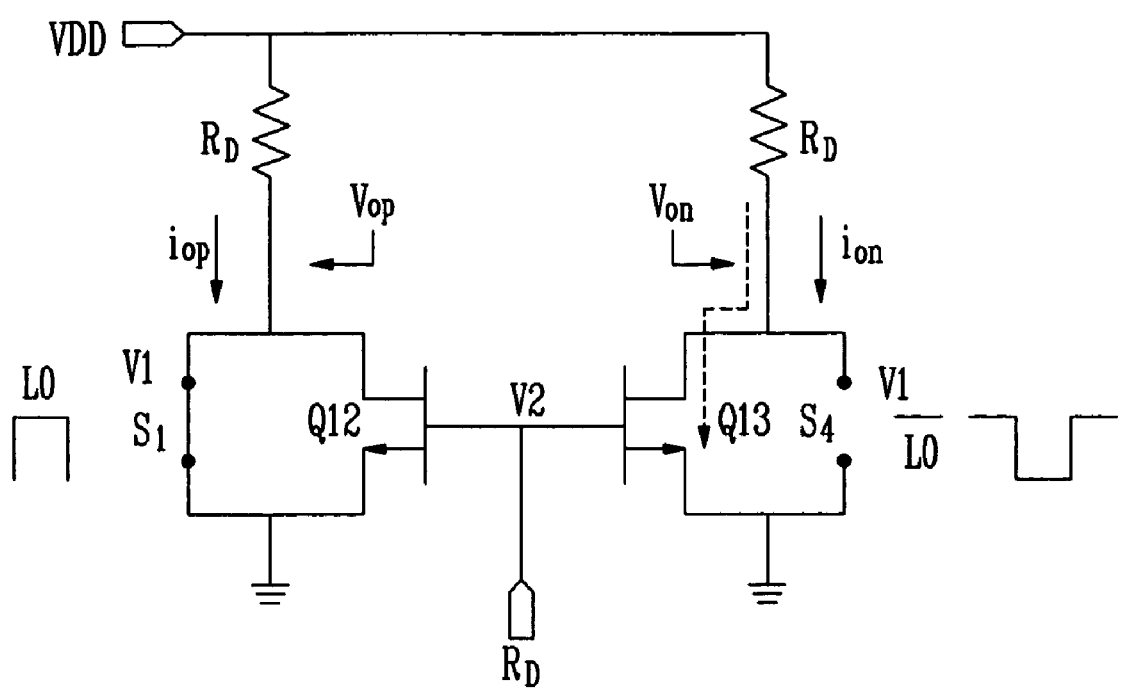
FIG. 4 is a circuit diagram for illustrating operation of a direct-conversion frequency mixer according to an embodiment of the present invention.

Operation of the direct-conversion frequency mixer according to the present invention will now be described with reference to FIG. 4.

For illustration, assuming that differential square waves LO and $\overline{LO}$ of the transistors Q12 and Q13 are input, an AC voltage component of the gate electrode of the transistor Q12 becomes a logical signal LO. When the logical signal LO has a positive (+) value, a switch $S_1$ turns on and an RF signal $v_2$ causes a very small (+) output current $i_{op}$ to flow. In contrast, a switch $S_4$ turns off so that most of the (−) output current $i_{on}$ becomes a drain current of a transistor Q13.

$$i_o = i_{op} - i_{on} = -i_{d,M3} = -(-g_{m3} \cdot v_2), \text{ where, } v_1 > 0 \quad \text{[Equation 1]}$$

When the logical signal LO has a negative (−) value, the switch $S_1$ turns off and the switch $S_4$ turns on so that the transistor Q12 is activated while the transistor Q13 is not operating. Therefore, the output current is represented as shown in Equation 2:

$$i_o = i_{op} - i_{on} = -i_{d,M2} = -g_{m2} \cdot v_2), \text{ where, } v_1 < 0 \quad \text{[Equation 2]}$$

Therefore, the sign of the overall differential output current is determined by a signal of the logical signal LO, and the output signal can be represented as shown in Equation 3:

$$i_o = g_{m2} \cdot v_2 \cdot \text{sign}(v_1), \quad \text{[Equation 3]}$$

Assuming that the logical signal (LO) is a periodic function having a frequency of $f_{LO}$, a term sign ($v_{11}$) is a periodic square wave function. Therefore, with a Fourier series expansion, the output current can be expressed as Equation 4:

$$i_o = g_{m2} \cdot \sin(\varpi_2 t) \cdot \frac{\pi}{4} \left( \sin \varpi_1 t - \frac{1}{3} \sin 3\varpi_1 t + \frac{1}{5} \sin 5\varpi_1 t - \Lambda \right) \quad \text{[Equation 4]}$$

The above output current has the same form as the output current of the conventional single-balanced active frequency mixer. High order harmonic components having high frequencies can be easily removed using a low pass filter, so that frequency conversion required in the system can be achieved with the above principle.

Figure 1:
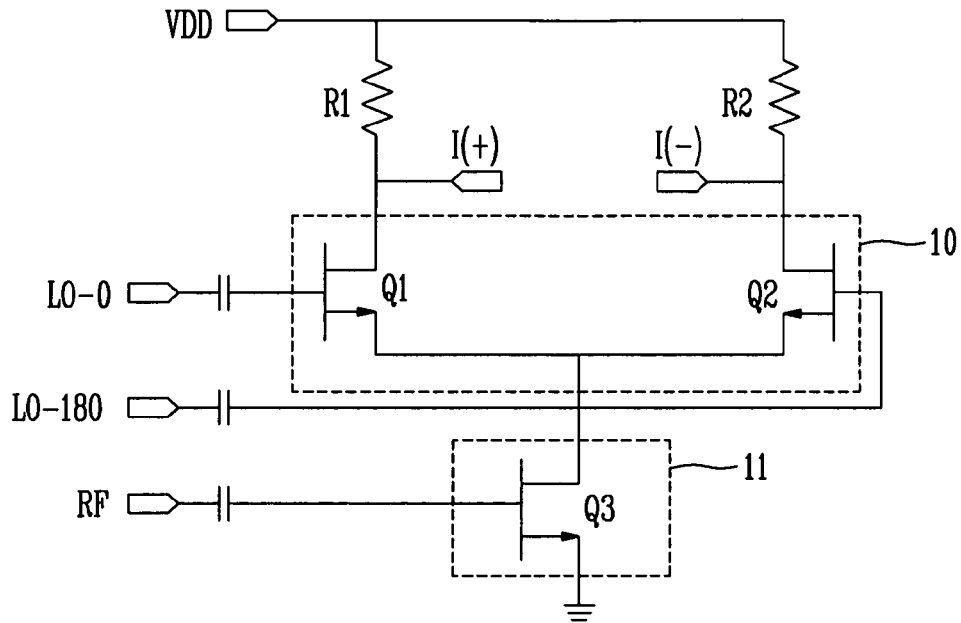
FIG. 1 is a circuit diagram of a typical single-balanced direct down-conversion frequency mixer.

The general single-balanced direct down-conversion frequency mixer includes a quadrature LO signal input unit 10 to which the quadrature LO signal is input, and an RF signal input unit 11 to which the RF signal is input, as shown in FIG. 1, which has a stacked structure. Thus, each stage uses a portion of the power source voltage so that voltage swing at the output stage is small. However, according to the present invention, the frequency mixer includes the first and second frequency mixing units 100 and 200, as shown in FIGS. 3A and 3B. Thus, compared with the conventional frequency mixer, the output voltage swing is large and frequency conversion can be performed even for a relatively low power source voltage VDD. In other words, unlike the conventional arrangement in which the input unit of the quadrature LO signal and the input unit of the RF signal are stacked each other, drains and sources of the transistor to which the quadrature LO signal is applied and the transistor to which the RF signal is applied are connected in common, respectively, so that the frequency mixer according to the present invention can be driven with a low power source voltage.

Figure 5:
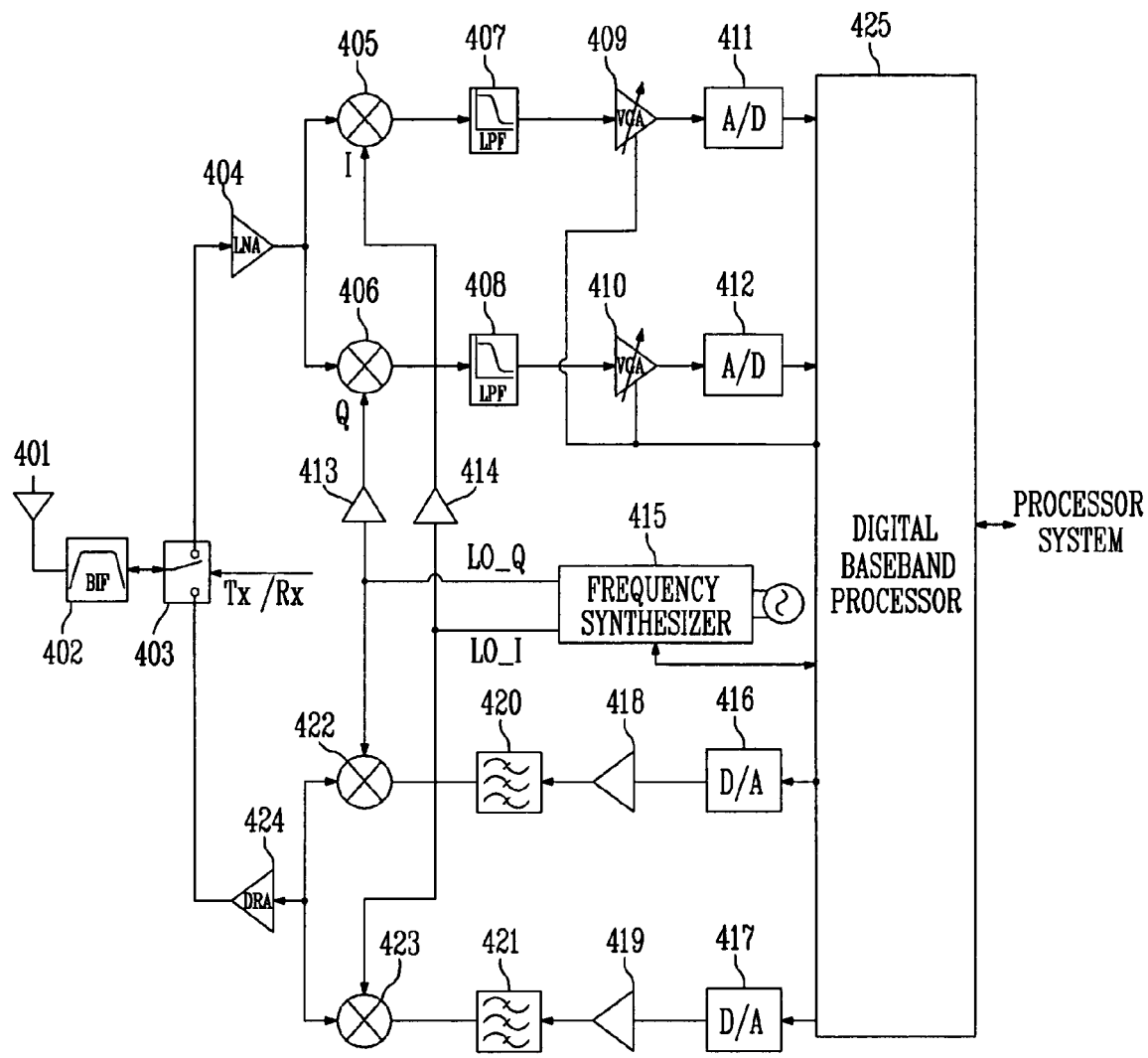
FIG. 5 is a block diagram of a radio frequency transceiver having the direct-conversion frequency mixer of an embodiment of the present invention.

FIG. 5 is a block diagram illustrating an example of a wide band RF transceiver using the frequency mixer of the present invention.

An RF electric signal received through a wide band antenna 401 is input to a low noise amplifier 404 through a band pass filter 402 and a transmission/reception selection switch 403. The RF signal amplified by the low noise amplifier 404 is input through the RF signal input terminal of the first and second down frequency mixing units 405 and 406 arranged as shown in FIGS. 3A and 3B. Along with this, sinusoidal local oscillation signals (LO_I, LO_Q), which are generated by a frequency synthesizer 415 to have a constant frequency and be different in a phase by 90 degrees, are amplified up to a sufficient power level through the quadrature LO signal mixers 413 and 414, and then input to the quadrature LO signal input terminals of the first and second down frequency mixing units 405 and 406.

The baseband signals whose frequencies are down converted into the baseband through the first and second down frequency mixing units 405 and 406 are passed through the baseband low pass filters 407 and 408, amplified by variable gain amplifiers 409 and 410, converted into digital signals by analog to digital converters 411 and 412, and then input to a digital baseband processor 425. The digital baseband processor 425 outputs only a predetermined frequency band signal among the digital signals output from the analog to digital converters 411 and 412.

Further, the signals output from the digital baseband processor 425 are passed through digital to analog converters 416 and 417, baseband signal amplifiers 418 and 419, baseband signal filters 420 and 421, and input to the first and second up frequency mixing units 422 and 423. Outputs of the first and second up frequency mixing units 422 and 423 are amplified in a drive amplifier 424, and then transferred to the antenna 401 through the transmission/reception selection switch 403 and the band pass filter 402.

The wide band radio frequency transceiver arranged as described above is similar to the conventional direction conversion receiver except it has the up and down frequency mixing units shown in FIGS. 3A and 3B. Thus, the wide band radio frequency transceiver can operate with a power source voltage lower than that needed for the conventional transceiver.

As described above, the present invention provides a frequency mixer, in which drains and sources of a transistor for receiving a quadrature LO signal and a transistor for receiving an RF signal are connected in common, and which is driven by a bias voltage supplied from a single voltage source. In other words, unlike the conventional arrangement in which the input unit of the quadrature LO signal and the input unit of the RF signal are stacked each other, the drains and the sources of the transistor for receiving the quadrature LO signal and the transistor for receiving the RF signal are connected in common, respectively, so that the driving power source voltage can be reduced to half that of the conventional device. Therefore, the frequency mixer according to an embodiment of the present invention is suitable for a low power system because it can be drive with a low power source voltage, and is applicable to an ultra-small and highly integrated circuit.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A direct-conversion frequency mixer comprising:
a $1^{st}$ frequency mixing unit (FMU) for direct-converting a single phase radio frequency (SPRF) signal into an in-phase baseband signal by using quadrature local oscillation (QLO) signals having respective phases of 0 degrees and 180 degrees such that the $1^{st}$ FMU comprises $1^{st}$, $2^{nd}$, $3^{rd}$, and $4^{th}$ transistors,
the $1^{st}$ and $4^{th}$ transistors of the $1^{st}$ FMU having gates coupled to 0 and 180 degree phase QLO signals, respectively,
the $2^{nd}$ and $3^{rd}$ transistors of the $1^{st}$ FMU having gates coupled to the SPRF signal, wherein
the $1^{st}$ and $2^{nd}$ transistors of the $1^{st}$ FMU having drains commonly coupled together and coupled to a bias voltage (VDD) such that a common drain node of the $1^{st}$ and $2^{nd}$ transistors of the $1^{st}$ FMU for outputting a positive in-phase baseband (IP+BB) signal,
the $3^{rd}$ and $4^{th}$ transistors of the $1^{st}$ FMU having drains commonly coupled together and coupled to the VDD such that a common drain node of the $3^{rd}$ and $4^{th}$ transistors of the $1^{st}$ FMU for outputting a negative in-phase baseband (IP−BB) signal; and
a $2^{nd}$ frequency mixing unit (FMU) for direct-converting SPRF signal into a quadrature-phase baseband signal by using QLO signals having respective phases of 90 degrees and 270 degrees such that the $2^{nd}$ FMU comprises four transistors,
the $1^{st}$ and $4^{th}$ transistors of the $2^{nd}$ FMU having gates coupled to 90 and 270 degree phase QLO signals, respectively,
the $2^{nd}$ and $3^{rd}$ transistors of the $2^{nd}$ FMU having gates coupled to the SPRF signal, wherein
the $1^{st}$ and $2^{nd}$ transistors of the $2^{nd}$ FMU having drains commonly coupled together and coupled to the VDD such that a common drain node of the $1^{st}$ and $2^{nd}$ transistors of the $2^{nd}$ FMU for outputting a positive quadrature phase baseband (QP+BB) signal, and
the $3^{rd}$ and $4^{th}$ transistors of the $2^{nd}$ FMU having drains commonly coupled together and coupled to the VDD such that a common drain node of the $3^{rd}$ and $4^{th}$ transistors of the $2^{nd}$ FMU for outputting a negative quadrature phase baseband (QP−BB) signal;

wherein the 1$^{st}$ FMU and the 2$^{nd}$ FMU are driven by the VDD supplied from a single voltage source and wherein the 1$^{st}$ FMU and the 2$^{nd}$ FMU are parallel to each other and not stacked relative to the VDD.

2. The direct-conversion frequency mixer according to claim 1, wherein the 1$^{st}$ and 2$^{nd}$ transistors of the 1$^{st}$ FMU having sources commonly coupled together, and the 3$^{rd}$ and 4$^{th}$ transistors of the 1$^{st}$ FMU having sources commonly coupled together VDD is applied to the drains of the 1$^{st}$ through 4$^{th}$ transistors of the 1$^{st}$ FMU.

3. The direct-conversion frequency mixer according to claim 2, wherein the sources of the 1$^{st}$ through 4$^{th}$ transistors of the 1$^{st}$ FMU are coupled to a ground node.

4. The direct-conversion frequency mixer according to claim 1, wherein the 1$^{st}$ and 2$^{nd}$ transistors of the 2$^{nd}$ FMU having sources commonly coupled together, and the 3$^{rd}$ and 4$^{th}$ transistors of the 2$^{nd}$ FMU having sources commonly coupled, wherein the VDD is applied to the drains of the 1$^{st}$ through 4$^{th}$ transistors of the 2$^{nd}$ FMU.

5. The direct-conversion frequency mixer according to claim 4, wherein the sources of the 1$^{st}$ through 4$^{th}$ transistors of the 2$^{nd}$ FMU are coupled to a ground node.

6. The direct-conversion frequency mixer according to claim 1, wherein the VDD is about 1.5 Volts or less.

7. The direct-conversion frequency mixer according to claim 1, further comprising a inductor coupled between the SPRF signal and the gates of the 2$^{nd}$ and 3$^{rd}$ transistors of the 1$^{st}$ FMU such that the inductor substantially matches an input impedance of the 1$^{st}$ FMU.

8. The direct-conversion frequency mixer according to claim 1, further comprising a inductor coupled between the SPRF signal and the gates of the 2$^{nd}$ and 3$^{rd}$ transistors of the 2$^{nd}$ FMU such that the inductor substantially matches an input impedance of the 2$^{nd}$ FMU.

9. The direct-conversion frequency mixer according to claim 1, further comprising:
 a 1$^{st}$ inductor coupled between the SPRF signal and the gates of the 2$^{nd}$ and 3$^{rd}$ transistors of the 1$^{st}$ FMU such that the first inductor substantially matches an input impedance of the 1$^{st}$ FMU; and
 a 2$^{nd}$ inductor coupled between the SPRF signal and the gates of the 2$^{nd}$ and 3$^{rd}$ transistors of the 2$^{nd}$ FMU such that the 2$^{nd}$ inductor substantially matches an input impedance of the 2$^{nd}$ FMU.

10. The direct-conversion frequency mixer according to claim 9, wherein the input impedance of the 1$^{st}$ FMU substantially matches the input impedance of the 2$^{nd}$ FMU.

11. The direct-conversion frequency mixer according to claim 1, wherein the 1$^{st}$ through 4$^{th}$ transistors of the 1$^{st}$ FMU and the 1$^{st}$ through 4$^{th}$ transistors of the 2$^{nd}$ FMU are metal-oxide semiconductor transistors.

12. The direct-conversion frequency mixer according to claim 1, wherein the IP+BB and the IP−BB signals are different in phase by 180 degrees.

13. The direct-conversion frequency mixer according to claim 1, wherein the QP+BB and the QP−BB signals are different in phase by 180 degrees.

* * * * *